United States Patent
Wu

[11] Patent Number: 5,957,728
[45] Date of Patent: Sep. 28, 1999

[54] DATA TRANSMISSION ADAPTER

[75] Inventor: Peter Wu, Taipei, Taiwan

[73] Assignee: Gorden Su, Taipei, Taiwan

[21] Appl. No.: 09/063,366

[22] Filed: Apr. 21, 1998

[51] Int. Cl.$^6$ .................................................. H01R 27/00
[52] U.S. Cl. ..................... 439/638; 439/906; 439/76.1; 439/654
[58] Field of Search ..................... 439/638, 639, 439/654, 76.1, 354, 687, 696, 731, 906

[56] References Cited

U.S. PATENT DOCUMENTS

| | | | |
|---|---|---|---|
| 3,668,476 | 6/1972 | Wrabel et al. | 439/76.1 |
| 4,392,701 | 7/1983 | Weidler | 439/638 |
| 4,929,195 | 5/1990 | Seidoh | 439/906 |
| 4,964,815 | 10/1990 | Kawai et al. | 439/906 |
| 4,998,183 | 3/1991 | Chiang | 439/76.1 |
| 5,108,313 | 4/1992 | Adams | 439/906 |
| 5,124,888 | 6/1992 | Suzuki et al. | 439/76.1 |
| 5,194,016 | 3/1993 | Hatagishi et al. | 439/354 |
| 5,406,450 | 4/1995 | Shieh | 439/638 |
| 5,411,401 | 5/1995 | Chiou | 439/638 |
| 5,836,774 | 11/1998 | Tan et al. | 439/76.1 |

*Primary Examiner*—Paula Bradley
*Assistant Examiner*—Tho D. Ta
*Attorney, Agent, or Firm*—Varndell & Varndell, PLLC

[57] ABSTRACT

A data transmission adapter includes a bottom cover shell, a top cover shell covered on the bottom cover shell, a circuit board mounted in the bottom cover shell, and two electric data transmission connectors reversely mounted on the circuit board, the top cover shell having a transverse partition board inserted in a gap between the electric data transmission connectors to separate the electric data transmission connectors from each other, two openings at front and rear side walls thereof in alignment with the receiving sides of the electric data transmission connectors for insertion of external electric connectors, a top locating block and two side ribs for positioning in a locating hole on a face panel or distributing frame, the bottom cover shell having a bottom hook and two side ribs for positioning.

1 Claim, 4 Drawing Sheets

DATA TRANSMISSION ADAPTER

BACKGROUND AND SUMMARY OF THE INVENTION

The present invention relates to a data transmission adapter, and more particularly to such a data transmission adapter which comprises a top cover shell, a bottom cover shell, a circuit board mounted inside the bottom cover shell, and two electric data transmission connectors reversely mounted on the circuit board and respectively supported on a partition wall of the top cover shell at opposite sides.

Conventionally, an electric data transmission connector is fixedly mounted on a circuit board for connection to an electric apparatus. When connecting the electric data transmission connector of a circuit board in one apparatus for example a camera to the electric data transmission connector of a circuit board in another apparatus for example a television, a cable must be used and connected between the electric data transmission connectors for data transmission. When connecting the electrical connector of the circuit board in the camera of television, the electric data transmission connector of the circuit board may be forced by insertion force to vibrate, causing the circuit to be broken.

According to one aspect of the present invention, the data transmission adapter comprises a top cover shell, a bottom cover shell, a circuit board mounted inside the bottom cover shell, and two electric data transmission connectors reversely mounted on the circuit board and respectively supported on a partition wall of the top cover shell at opposite sides. According to another aspect of the present invention, the top cover shell has a top locating block and two side ribs, and the bottom cover shell has a bottom hook and two side ribs. By means of the locating block, the side ribs and the hook, the data transmission adapter can be firmly installed in the mounting hole on the face panel or distributing frame. According to still another aspect of the present invention, the electric data transmission connectors can be female connectors or male connectors, or one female connector with one male connector. Because two electric data transmission adapters are reversely mounted on the circuit board, changing the positions of data signal lines is easy.

DETAILED DESCRIPTION OF THE PREFERRED EMBODIMENT

Referring to FIGS. from 1 to 4, a data transmission adapter in accordance with the present invention is generally comprised of a bottom cover shell 1, a circuit board 2, two electric data transmission connectors 3, and a top cover shell 4.

Figure 2:
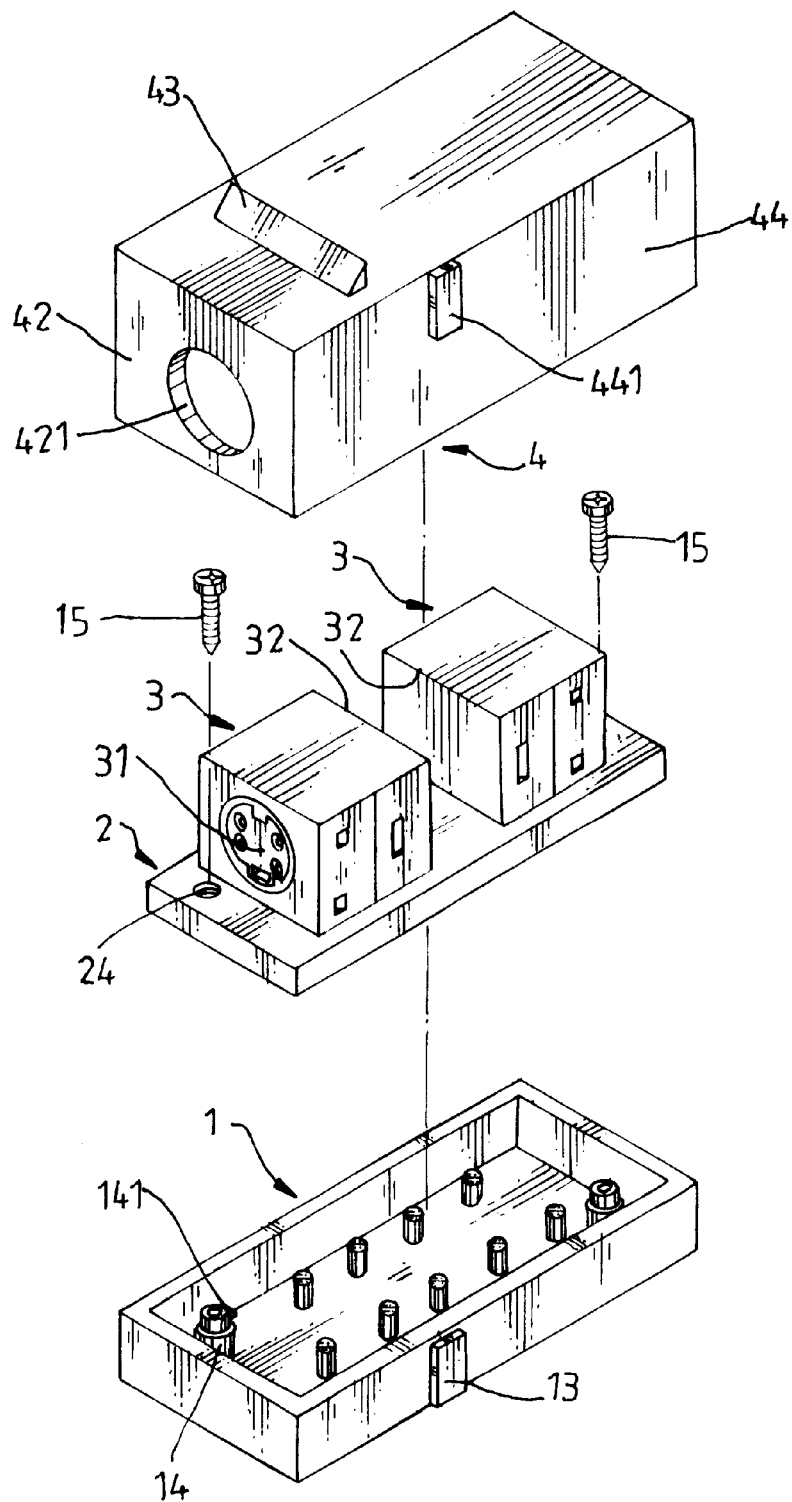
FIG. 2 is an exploded view of the data transmission adapter shown in FIG. 1.
Figure 3:
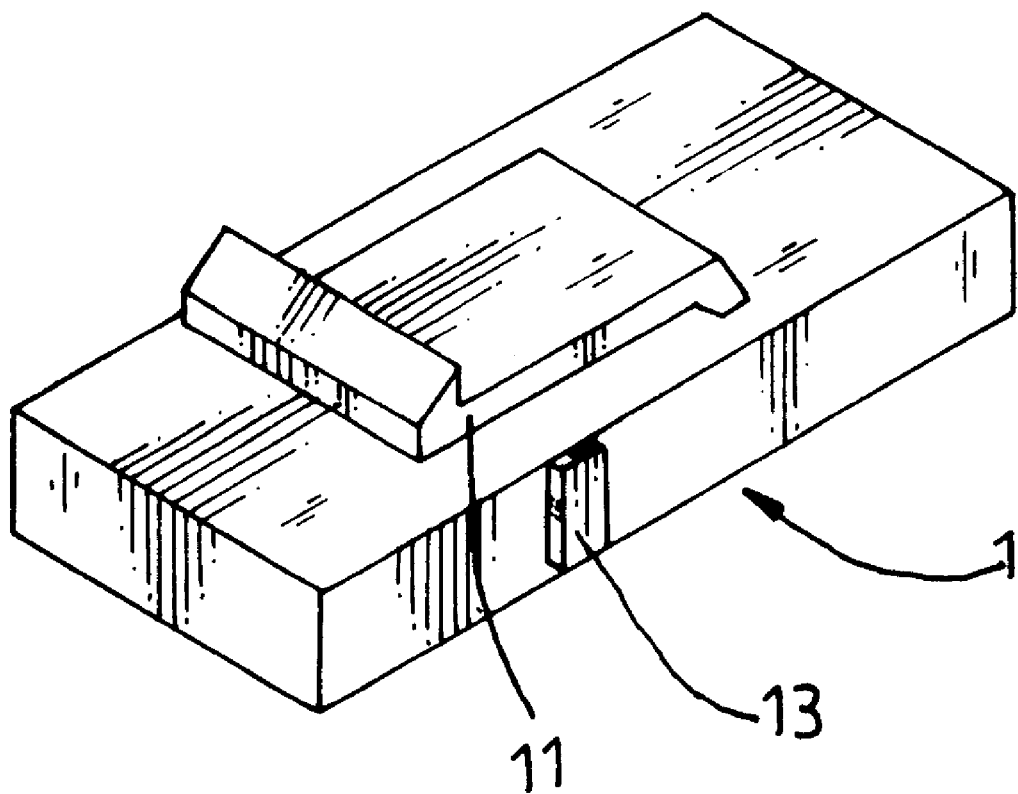
FIG. 3 is a perspective back side view of the bottom cover shell according to the present invention.

Referring to FIGS. 2 and 3 again, the bottom cover shell 1 comprises a positioning hook 11 integral with the bottom side wall thereof on the outside (see FIG. 3), two locating ribs 13 respectively raised from two opposite upright lateral side walls thereof on the outside, and a plurality of internally threaded upright locating tubes 14 raised from the inside. Each upright locating tube 14 has an upwardly extended coupling portion 141 of reduced diameter.

Referring to FIG. 2 again, the circuit board 2 is mounted within the bottom cover shell 1, having a plurality of mounting holes 24 into which the upwardly extended coupling portions 141 of the internally threaded upright locating tubes 14 are fitted and then secured in place by a respective screw 15.

Referring to FIG. 2 again, the electric data transmission connectors 3 are mounted on the circuit board 2 in reversed directions. Each electric data transmission connector 3 comprises a receiving side 31 at one side namely the front side, and a back side 32 opposite to the front side. The receiving side 31 can be a socket, or a plug. When the electric data transmission connectors 3 are installed in the circuit board 2, the back sides 32 of the electric data transmission connectors 3 face each other and spaced from each by a gap.

Figure 4:
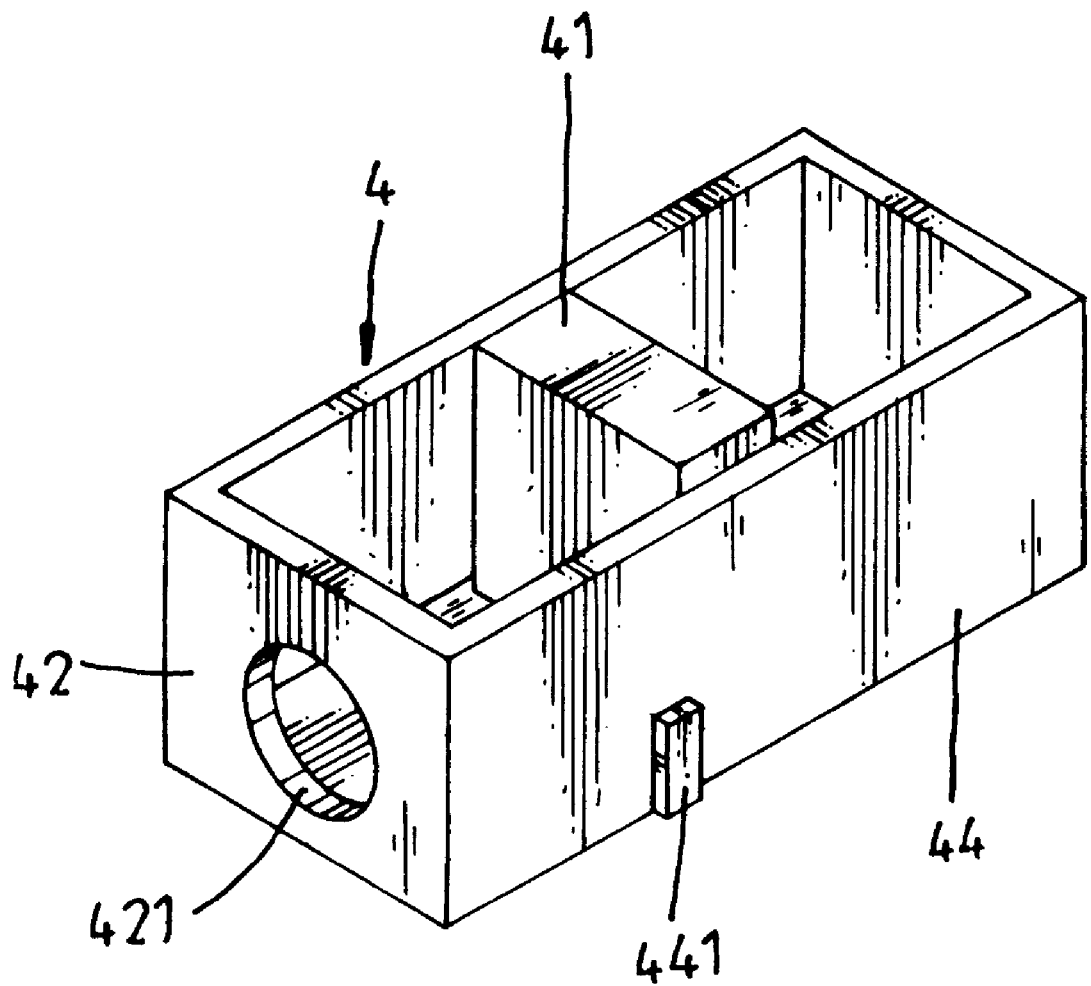
FIG. 4 is a perspective back side view of the top cover shell according to the present invention.

Referring to FIGS. 2 and 4 again, the top cover shell 4 comprises a transverse partition board 41 vertically disposed on the middle, two openings 421 respectively provided at vertical front and rear side walls 42 thereof corresponding to the receiving sides 31 of the electric data transmission connector 3, a transversely extended locating block 43 integral with the top side wall thereof on the outside, and two locating ribs 441 respectively raised from two opposite upright lateral side walls 44 thereof on the outside.

Figure 1:
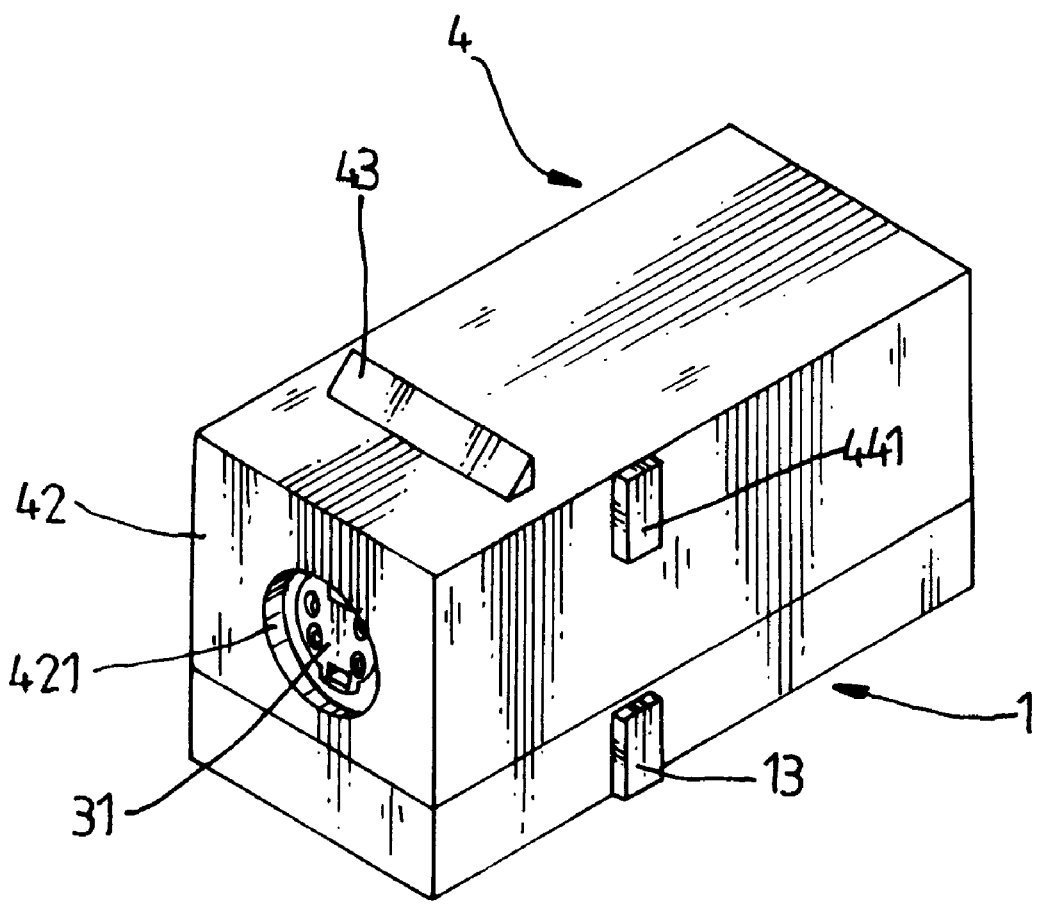
FIG. 1 is a perspective view of a data transmission adapter according to the present invention.

Referring to FIGS. 1 and 2 again, after the electric data transmission connectors 3 have been installed in the circuit board 2 and the circuit board 2 have been fixedly fastened to the bottom cover shell 1 on the inside, the top cover shell 4 is covered on the bottom cover shell 1 and sealed by a ultrasonic sealing apparatus to protect the circuit board 2 and the electric data transmission connectors 3, and to separate the electric data transmission connectors 3 from each other by the partition board 41. The partition board 41 serves as support means to support the electric data transmission connectors 3 against the insertion force of a cable. When the data transmission adapter is assembled, the receiving sides 31 of the electric data transmission connectors 3 are respectively retained to the openings 421 on the vertical front and rear side walls 42 of the top cover shell 4 for connection of an external electric connector. By means of the positioning hook 11 and the locking block 43, the data transmission adapter can be conveniently and firmly mounted in a locating hole on a face panel or distributing frame.

Furthermore, during the assembly process of the data transmission adapter, two male electric data transmission connectors, two female electric data transmission connectors, or one male electric data transmission connector and one female electric data transmission connector can be installed in the circuit board 2 to meet different requirements.

I claim:

1. A data transmission adapter comprising:

a bottom cover shell, said bottom cover shell comprising a hook integral with a bottom side wall thereof on the outside for mounting, and two locating ribs respectively raised from two opposite upright lateral side walls thereof on the outside for positioning;

a circuit board fixedly mounted inside said bottom cover shell;

two electric data transmission connectors mounted on said circuit board in reversed directions and spaced from each other by a gap, said electric data transmission connectors each having a receiving side disposed in direction reversed to each other; and a top cover shell covered on said bottom cover shell over said circuit board and said electric data transmission connectors, said top cover shell comprising a transverse partition board vertically disposed on the middle and inserted into the gap between said electric data transmission connectors for supporting said electric data transmission connectors against insertion force of mating contacts, two openings respectively provided at vertical front and rear side walls thereof and aligned with the receiving sides of said electric data transmission connectors respectively, a transversely extended locating block integral with a top side wall thereof on the outside for mounting, and two locating ribs respectively raised from two opposite upright lateral side walls thereof on the outside for positioning.

* * * * *